United States Patent [19]

Itoh et al.

[11] Patent Number: 5,215,823
[45] Date of Patent: Jun. 1, 1993

[54] PROCESS FOR FORMING SOLID LUBRICATING FILM ON IRON-BASE ALLOY SUBSTRATE AND SLIDING MEMBER HAVING THE SOLID LUBRICATING FILM

[75] Inventors: Akio Itoh; Tatsumi Hioki, both of Nagoya; Junichi Kawamoto, Aichi, all of Japan

[73] Assignee: Kabushiki Kaisha Toyota Chuo Kenkyusho, Aichi, Japan

[21] Appl. No.: 698,500

[22] Filed: Apr. 12, 1991

[30] Foreign Application Priority Data

Apr. 24, 1990 [JP] Japan .................. 2-108386

[51] Int. Cl.$^5$ .............................. B32B 18/00
[52] U.S. Cl. ...................... 428/469; 428/472; 428/472.1; 428/472.2; 428/408; 428/685; 428/688; 428/689; 428/697; 428/698; 428/699; 428/704; 148/317; 148/318; 148/319
[58] Field of Search ............ 428/469, 472, 472.1, 428/472.2, 688, 689, 697, 698, 699, 704, 685, 408; 148/902, 906, 317, 318, 319; 427/248.1, 249

[56] References Cited

U.S. PATENT DOCUMENTS

| | | | |
|---|---|---|---|
| 2,207,289 | 7/1940 | Fleischmann | 148/319 |
| 3,969,130 | 7/1976 | Bokros | 427/249 |
| 4,237,177 | 12/1980 | Slama et al. | 428/408 |
| 4,554,208 | 11/1985 | MacIver et al. | 428/408 |
| 4,661,409 | 4/1987 | Kieser et al. | 428/408 |
| 4,772,513 | 9/1988 | Sakamoto et al. | 428/408 |
| 4,917,953 | 4/1990 | Hioki et al. | 428/408 |
| 4,917,961 | 4/1990 | Tsujii et al. | 428/698 |

FOREIGN PATENT DOCUMENTS 60-159168 8/1985 Japan .
63-215578 9/1988 Japan .

Primary Examiner—Ellis P. Robinson
Assistant Examiner—Timothy M. Speer
Attorney, Agent, or Firm—Oblon, Spivak, McClelland, Maier & Neustadt

[57] ABSTRACT

In a process for forming a solid lubricating film on an iron-base substrate, an organic material having a vapor pressure of $10^{-4}$ Torr or less at room temperature is deposited on an iron-base alloy substrate in a vacuum atmosphere in a vacuum degree of $10^{-4}$ Torr or more, and simultaneously ions of a metal element having a chemical affinity to carbon is irradiated on the iron-base alloy substrate at a dose of $1 \times 10^{16}$ ions/cm$^2$ or more, the ions having an energy of 5 keV or more. Accordingly, the iron-base substrate is coated with a solid lubricating film which includes an atom mixture layer including carbide of the metal element and alloy of iron and the metal element and a carbon layer including amorphous carbon. Hence, the solid lubricating film has an excellent lubricating property as well as a high adhesion property to the iron-base substrate. Namely, the excellent lubricating property will last for a long period of time.

5 Claims, 5 Drawing Sheets

PROCESS FOR FORMING SOLID LUBRICATING FILM ON IRON-BASE ALLOY SUBSTRATE AND SLIDING MEMBER HAVING THE SOLID LUBRICATING FILM

BACKGROUND OF THE INVENTION

1. Field of the Invention

The present invention relates to a process for forming a solid lubricating film on an iron-base alloy substrate such as steel or the like, and a sliding member having a solid lubricating film. In particular, the present invention is applicable to precision sliding component parts for automobiles, electronic appliances or the like. For instance, it is applicable to bearings, mechanical seals, sliding component parts of various pumps or the like therefor.

2. Description of the Related Art

A carbonaceous film has been formed on a substrate of a sliding component part in order to give a lubricating property thereto. The carbonaceous film comprises a carbon-base solid lubricant such as graphite or the like. As for a process for forming the film, a substrate is first coated with an organic polymer, and thereafter an ion irradiation is carried out thereon. Further, another process is proposed in Japanese Unexamined Patent Publication No. 215578/1988, in which an organic material is heated and deposited on a substrate comprising a ceramic, and ions of a predetermined gas element are irradiated thereon, thereby forming a carbonaceous film having a high adhesion property.

In the precision sliding component parts, their sliding portions are required to have a high dimensional accuracy, and further the high dimensional accuracy should be maintained for a long period of time. Accordingly, the film thickness of the carbonaceous film should be made as thin as possible, and the adhesion property thereof to a substrate should be enhanced.

However, the carbonaceous film formed by the above-described process, in which a substrate is first coated with an organic polymer, and thereafter an ion irradiation is carried out thereon, suffers from a large density variation (i.e., contraction) occurring therein. Accordingly, a large strain stress occurs in an interface between the carbonaceous film and the substrate. Therefore, the carbonaceous film has a poorer adhesion property to the substrate, and also has a shorter life.

Further, in the carbonaceous film formed by the process set forth in the Japanese Unexamined Patent Publication No. 215578/1988, the density variation, resulting from the carbonizing organic material, occurs during a stage of an extremely thin film thickness, e.g., during a stage of a single molecule layer or a couple of molecules layer. Therefore, the contraction occurs freely without being restricted. Since the extremely thin film layers are deposited continuously in this process, the carbonaceous film thus formed does not contain the strain stress substantially. Therefore, the carbonaceous film has an enhanced adhesion property to the substrate made of a ceramic, and has a longer life.

However, the carbonaceous film, formed by the process set forth in the Japanese Unexamined Patent Publication No. 215578/1988, comes to have a shorter life when it is slided under a severer sliding condition. Further, in the case where a substrate made of an iron-base alloy is employed in this process, it might be pointed out that the adhesion property of the carbonaceous film to the substrate is expected to improve due to a chemical bond which arises between the substrate made of an iron-base alloy and the carbonaceous film and binds the iron and carbon elements. Although there arises the chemical bond between the iron and carbon elements, it cannot make the carbonaceous film into a solid lubricating film having a longer life under a severer sliding condition.

SUMMARY OF THE INVENTION

It is therefore an object of the present invention to solve the problems associating with the above-described related arts. In particular, it is another object of the present invention to provide a process for forming a solid lubricating film having a high adhesion property to an iron-base alloy substrate. It is a further object of the present invention to provide a sliding member which has a solid lubricating film having a high adhesion property, i.e., a long life.

The above and other objects of the present invention can be achieved by a process for forming a solid lubricating film according to the present invention. The process comprises the steps of:

(1) disposing an iron-base alloy substrate in a vacuum atmosphere in a vacuum degree of $10^{-4}$ Torr or more; and (2) depositing an organic material having a vapor pressure of $10^{-4}$ Torr or less at room temperature on the iron-base alloy substrate in the vacuum atmosphere, and simultaneously irradiating ions of a metal element having a chemical affinity to carbon on the iron-base alloy substrate at a dose of $1 \times 10^{16}$ ions/cm$^2$ or more, the ions having an energy of 5 keV or more.

The first step of the process according to the present invention is a step in which an iron-base alloy substrate is disposed in a vacuum atmosphere. In the process according to the present invention, since the depositing and the ion irradiation are carried out simultaneously as hereinafter described, a vacuum atmosphere in a vacuum degree of $10^{-4}$ Torr or more is formed in the first step, and then an iron-base alloy substrate is disposed in the vacuum atmosphere. In a vacuum atmosphere in a vacuum degree of less than $10^{-4}$ Torr, it is hard to carry out the ion irradiation desirably.

The second step of the process according to the present invention is a step in which an organic material is deposited and simultaneously ions of a metal element are irradiated on the iron-base alloy substrate in the vacuum atmosphere.

In the second step, since the organic material to be deposited is disposed in the high vacuum in the vacuum degree of $10^{-4}$ Torr or more, it should have a vapor pressure of $10^{-4}$ Torr or less at room temperature. In addition, since the organic material is required to vaporize uniformly, it is preferred that the organic material is in a liquid state. As an organic material satisfying these requirements, silicone-base polymers or oils and hydrocarbon-base polymers or oils may be used. Methylphenylsiloxane is an example of the silicone-base polymers or oils, and in particular, pentaphenyl-trimethyltrisiloxane may be employed. Alkylnaphthalene is an example of the hydrocarbon-base polymers or oils.

Further, in the second step, the metal element to be irradiated on the iron-base alloy substrate as an ion beam is one which is capable of decomposing and carbonizing the organic material, which has a chemical affinity to carbon at the same time, and which is capable of mixing with the iron-base alloy. As a metal element satisfying these requirements, titanium (Ti) and tantalum (Ta) may be employed.

Furthermore, the metal element is made into ions having an energy of 5 keV or more, and an ion beam including the ions is irradiated on the iron-base alloy substrate. The metal element is thus accelerated in order to decompose and carbonize the organic material, deposit the decomposed and carbonized organic material on the iron-base alloy substrate in a high density thereby forming a carbon layer, and form an atom mixture layer including the metal element distributed predeterminately in an interface between the carbon layer and the ion-base alloy substrate. In addition, the ions are irradiated on the iron-base alloy substrate at a dose of $1 \times 10^{16}$ ions/cm$^2$ or more. The ions are thus irradiated in order to make a solid lubricating film including the carbon layer and the atom mixture layer, and give a predetermined adhesion property to the iron-base alloy substrate.

In accordance with the thus arranged process of the present invention, it is possible to manufacture a sliding member having a solid lubricating film according to the present invention. The sliding member comprises:

an iron-base alloy substrate; and a solid lubricating film including:

an atom mixture layer being formed by irradiating ions of a metal element on the iron-base alloy substrate and including elements constituting the iron-base alloy substrate, the irradiated metal element and carbon; and a carbon layer being formed integrally on the atom mixture layer and mainly including carbon.

In the second step of the process according to the present invention, the organic material is turned into molecule forms or cluster forms, and then the organic material flies and deposits on the iron-base alloy substrate. At the same time, the metal element, having a chemical affinity to carbon and capable of mixing with the iron-base alloy, is turned into the ion beam having the energy of 5 keV or more, and irradiated on the iron-base alloy substrate at the dose of $1 \times 10^{16}$ ions/cm$^2$ or more. The ions of the metal element collide with the organic material in the molecule forms or cluster forms, and transform the organic material into inorganic materials containing a large amount of carbon. The inorganic materials containing a large amount of carbon deposit on the iron-base alloy substrate, and accumulate thereon temporarily. Further, when the ions of the metal element are irradiated thereon, the inorganic materials, including a large amount of carbon, deposited and accumulated temporarily thereon, collide with the ions of the metal element. Accordingly, the inorganic materials are injected into the surface portion of the iron-base alloy substrate while they are dispersing in all directions. At the same time, the irradiated ions of the metal element are also injected into the surface portion of the iron-base alloy substrate.

In this way, the solid lubricating film according to the present invention is formed on the iron-base alloy substrate. The solid lubricating film comprises the atom mixture layer including elements constituting the iron-base alloy substrate, the irradiated metal element and carbon, and the carbon layer formed integrally on the atom mixture layer and mainly including carbon. In the solid lubricating film, the metal element is made to exhibit a concentration distribution curve having a peak at an interface between the iron-base alloy substrate and the carbon layer (i.e., in the atom mixture layer) by ionizing the metal element into the ions having the high energy and irradiating the ions as described above.

In the atom mixture layer, the metal element injected into the surface portion of the iron-base alloy substrate by the ion irradiation and the elements constituting the iron-base alloy substrate form the atom mixture layer which is in a metallic compound-like state, an alloy-like state or the like. Consequently, the solid lubricating film according to the present invention has an improved adhesion property between the atom mixture layer and the iron-base alloy substrate. In addition, since the metal element has a chemical affinity to carbon, the solid lubricating film also has an improved adhesion property between the atom mixture layer and the carbon layer formed integrally thereon and mainly including carbon. When a solid lubricating film is formed in accordance with the present invention, it is possible to form a solid lubricating film having improved adhesion properties. Hence, the life of the solid lubricating film becomes much longer.

Further, since the sliding member, having the solid lubricating film including the atom mixture layer formed in accordance with the present invention, also has the carbon layer which includes amorphous carbon in a large amount, the sliding member has a low friction property and a low abrasion property. Hence, the sliding member exhibits a favorable lubricating property. Additionally, since the solid lubricating film has a longer life, it is apparent that these favorable properties will last for a longer period of time.

Therefore, the process for forming a solid lubricating film on an iron-base alloy substrate according to the present invention is suitable for reducing a friction coefficient of a sliding member made of an iron-base alloy material, and for enhancing wear resistance, for inhibiting seizure thereof, and for initially breaking in the sliding member. In addition, even when the sliding member having the solid lubricating film according to the present invention slides on a mating component part under a severe condition such as a high load, a high surface pressure or the like, the sliding member exhibits a low friction coefficient, and the characteristic will last for a long period of time. Consequently, the sliding member is appropriate for precision sliding component parts for automobiles or electronic appliances. For instance, the sliding member is appropriate for bearings, mechanical seals, sliding component parts of various pumps or the like for automobiles or electronic appliances.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Having generally described the present invention, a further understanding can be obtained by reference to the specific preferred embodiments which are provided herein for purposes of illustration only and are not intended to limit the scope of the appended claims.

Figure 1:
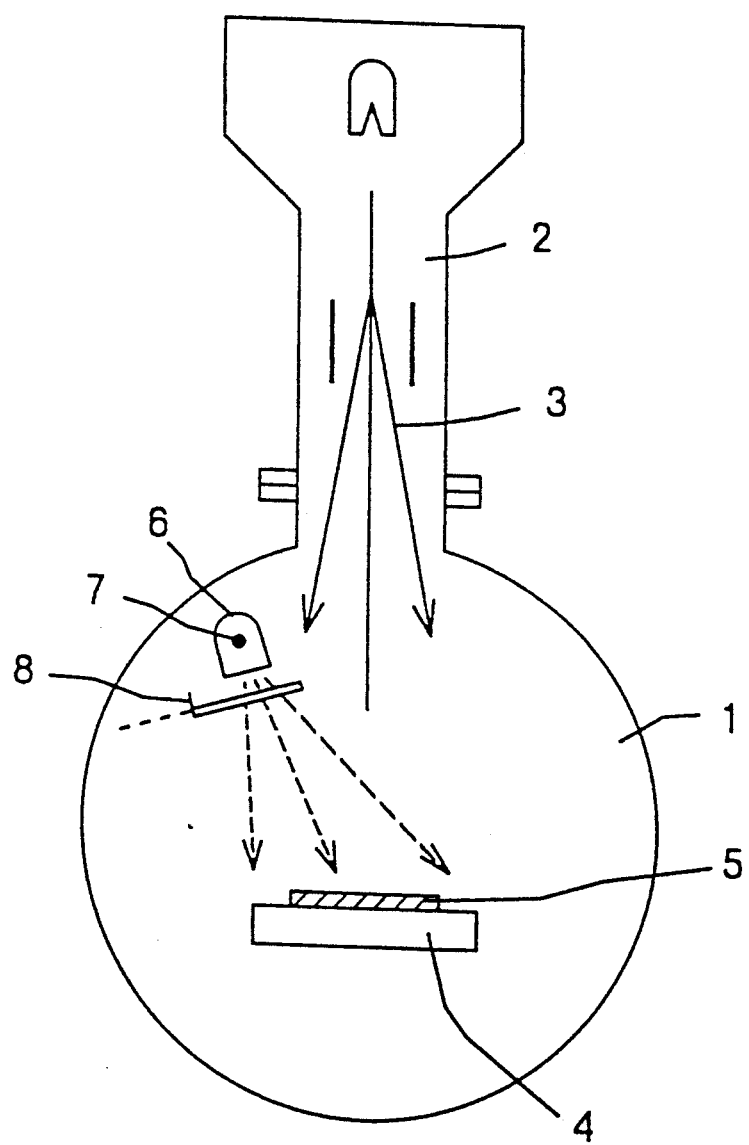
FIG. 1 is a schematic diagram of a solid lubricating film forming apparatus employed in a process for forming a solid lubricating film on an iron-base alloy substrate according to the present invention.

Preferred embodiments of the present invention will be hereinafter described with reference to the accompanying drawings. First of all, a solid lubricating film forming apparatus employed in the following preferred embodiments will be described with reference to FIG. 1. As illustrated in FIG. 1, the solid lubricating film forming apparatus comprises a flask-shaped vacuum container 1 disposed at a lower part thereof, an ion beam generating apparatus 2 for generating a high energy ion beam 3 disposed on the vacuum container 1 at an upper portion thereof, a substrate holder 4 for holding a substrate 5 disposed in the vacuum container 1 at a central portion thereof, a heating furnace 6 disposed at a position placed obliquely with respect to the substrate holder 4 so as not to interfere with the ion beam 3, and a shutter 8 for controlling a depositing amount of the organic material 7. The thus constructed solid lubricating film forming apparatus was employed in the First, Second, Third, Fourth and Fifth Preferred Embodiments hereinafter described.

FIRST PREFERRED EMBODIMENT

In the First Preferred Embodiment, a disk was employed as the substrate 5. The disk had a thickness of 3 mm, a diameter of 30 mm, a surface roughness of 0.1 micrometer Rz (ten-point mean roughness), and is made of a high carbon chromium bearing steel (SUJ2 as per JIS). As the organic material 7, pentaphenyl-trimethyltrisiloxane, one of the silicone-base polymers or oils, was employed. As the metal element having a chemical affinity to carbon, titanium (Ti) was employed.

At first, the pentaphenyl-trimethyltrisiloxane (hereinafter simply referred to as organic material 7) was disposed in the heating furnace 6. Then, the disk-shaped substrate 5 made of the SUJ2 steel is installed on the substrate holder 4, and disposed in the vacuum container 1, and the vacuum container 1 was evacuated to the high vacuum degree of $10^{-6}$ Torr. Thereafter, the heating furnace 6 was heated to a furnace temperature of 90° C., and the shutter 8 was opened. Thus, the organic material 7 flied in the forms of molecules or clusters, and deposited on the substrate 5. When the shutter 8 is opened, the ion beam generating apparatus 2 was actuated at the same time. Thus, the titanium (Ti) was turned into $Ti^+$ ions having a high energy of 200 keV, and an ion beam 3 of the $Ti^+$ ions were irradiated on the substrate 5. During the irradiation, an ion current density was approximately 2 microamperes/cm$^2$. In the First Preferred Embodiment, the operation, namely depositing and simultaneously irradiating the ions, was carried out for approximately 1 hour under the above-described conditions. As a result, the $Ti^+$ ions were irradiated in a dose of $1 \times 10^{17}$ ions/cm$^2$. A thickness of the solid lubricating film 50 thus obtained was measured by a back-scattering spectroscopy and by another method employing a surface roughness meter, and found to be $0.3+/-0.05$ micrometers by the both methods.

During the deposition and ion irradiation, the $Ti^+$ ions collided with the organic material 7 flying in the forms of molecules or clusters, and broke weak chemical bonds in the molecules of the organic material 7. For instance, the $Ti^+$ ions broke the C—H bonds, thereby decomposing the organic material 7. Accordingly, the hydrogen atoms and the oxygen atoms were released from the organic material 7, most of them were bonded to form hydrogen molecules and oxygen molecules, and the molecules were evacuated to the outside.

In this way, the organic material 7 was converted into inorganic materials including a large amount of carbon and small amounts of silicon, hydrogen and oxygen. The inorganic materials deposited on the substrate 5, and accumulated thereon temporarily. When the $Ti^+$ ions were further irradiated, the inorganic materials collided with the $Ti^+$ ions, and were injected into the surface portion of the substrate 5 while they were dispersing in all directions. At the same, the irradiated $Ti^+$ ions were also injected into the surface portion of the substrate 5.

Figure 2:
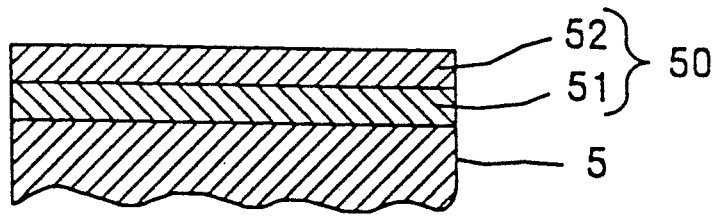
FIG. 2 is a schematic cross sectional diagram of a sliding member having a solid lubricating film according to the present invention.

In accordance with the operations described above, a solid lubricating film 50 was formed. The solid lubricating film 50 had a cross section as schematically illustrated in FIG. 2, and included an atom mixture layer 51 formed on the surface of the substrate 5 and including metal elements, such as iron (Fe) constituting the SUJ2 steel, titanium and carbon, and a carbon layer 52 mainly including carbon. The titanium in the atom mixture layer 51 of the solid lubricating film 50 forms an iron-titanium alloy together with the iron in the substrate 5, and the resulting solid solution enhances the ferritic structure of the SUJ2 steel. Further, since the titanium has an extremely high affinity to carbon, it forms stable titanium carbide (TiC) between the atom mixture layer 51 and the carbon layer 52 formed integrally thereon.

Consequently, since the atom mixture layer 51 was interposed between the carbon layer 52 and the substrate 5, the solid lubricating film 50 formed in the First Preferred Embodiment had a remarkably improved adhesion property to the substrate 5. That is, excellent low friction and abrasion properties of the solid lubricating film 50, or a high lubricating property thereof, lasted for a long period of time.

First Evaluation Test

In order to evaluate the solid lubricating film 50 formed as described above, a First Evaluation Test was carried out as hereinafter described. For comparison purpose, a Comparative Example No. 1 and a Comparative Example No. 2 were prepared and evaluated similarly. The Comparative Example No. 1 was prepared under the same conditions as the First Preferred Embodiment except that argon ions (Ar+) having a high energy of 200 keV were irradiated instead of the Ti+ ions, and the Comparative Example No. 2 was a simple disk-shaped substrate 5 made of the SUJ2 steel which had not been treated at all.

Figure 3:
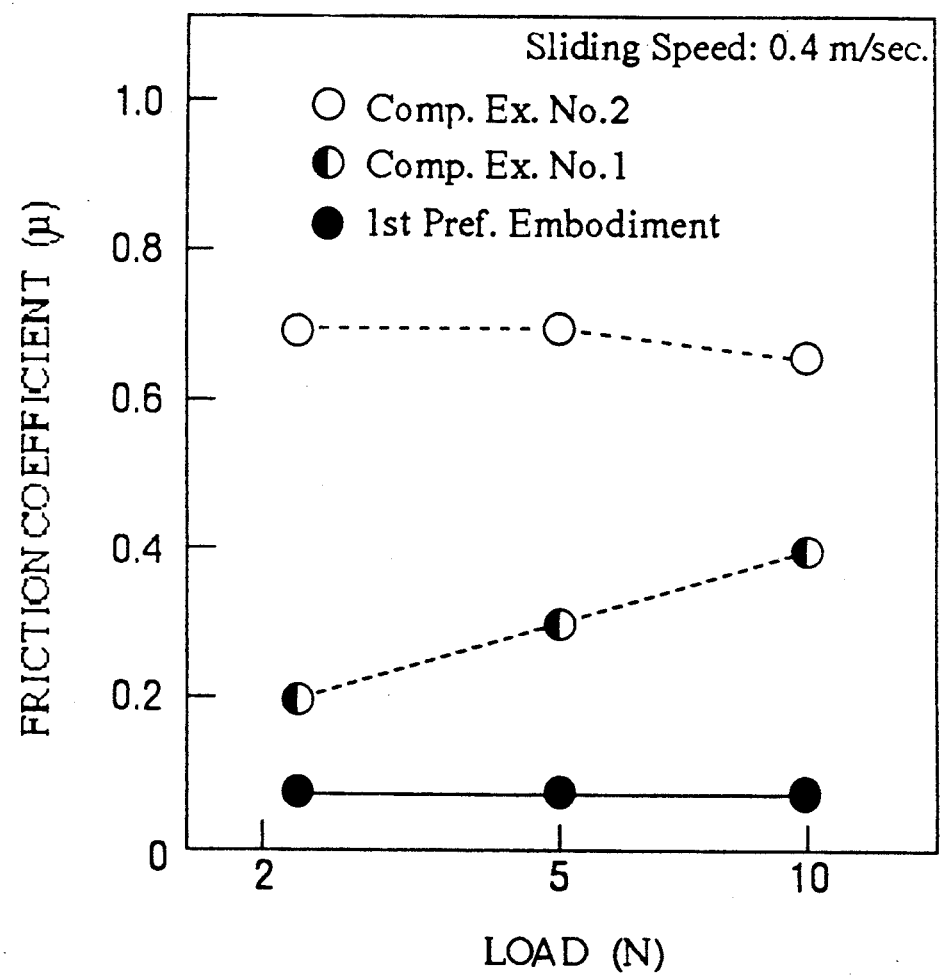
FIG. 3 is a graph showing relationships between friction coefficients of disks and pin loads applied to the disks, and the disks were made of SUJ2 (as per Japanese Industrial Standard (JIS)) and had solid lubricating films formed in accordance with a First Preferred Embodiment of the present invention, a Comparative Example No. 1 and a Comparative Example No. 2.

The First Evaluation Test was carried out by employing a pin-on-disk type friction and abrasion tester, in which a sphere-headed pin, having a diameter of 5 mm at an end and made of the SUJ2 steel, was slided on the disks obtained in accordance with the First Preferred Embodiment, the Comparative Example No. 1 and the Comparative Example No. 2 under the following conditions. Namely, in the First Evaluation Test, the disks were rotated at 500 rpm (i.e., at a sliding speed of approximately 0.4 m/sec.) under no lubrication in air at room temperature while the pin load was varied in a range of 2.2 to 10N. FIG. 3 shows the relationships between the pin loads and the friction coefficients ($\mu$) exhibited by the disks when the disks and the pin were slided for 1 hour under the above-described conditions.

It is apparent from FIG. 3 that the disk having the solid lubricating film 50 obtained in accordance with the First Preferred Embodiment had a lubricating property far superior to those of the disk obtained in accordance with the Comparative Example No. 1 and the disk of the Comparative Example No. 2 being free from any treatment. Further, it was also found that the excellent lubricating property hardly deteriorated even under the severe testing conditions, namely even when the evaluation test was carried out at the pin load of 10N.

Second Evaluation Test

The solid lubricating film 50 obtained in accordance with the First Preferred Embodiment was analyzed by the Auger electron spectroscopy in order to find what an element concentration distribution it has in the depth-wise direction, namely in the depth-wise direction away from the carbon layer 52 to the substrate 5 by way of the atom mixture layer 51. The results are shown in FIG. 4.

Figure 4:
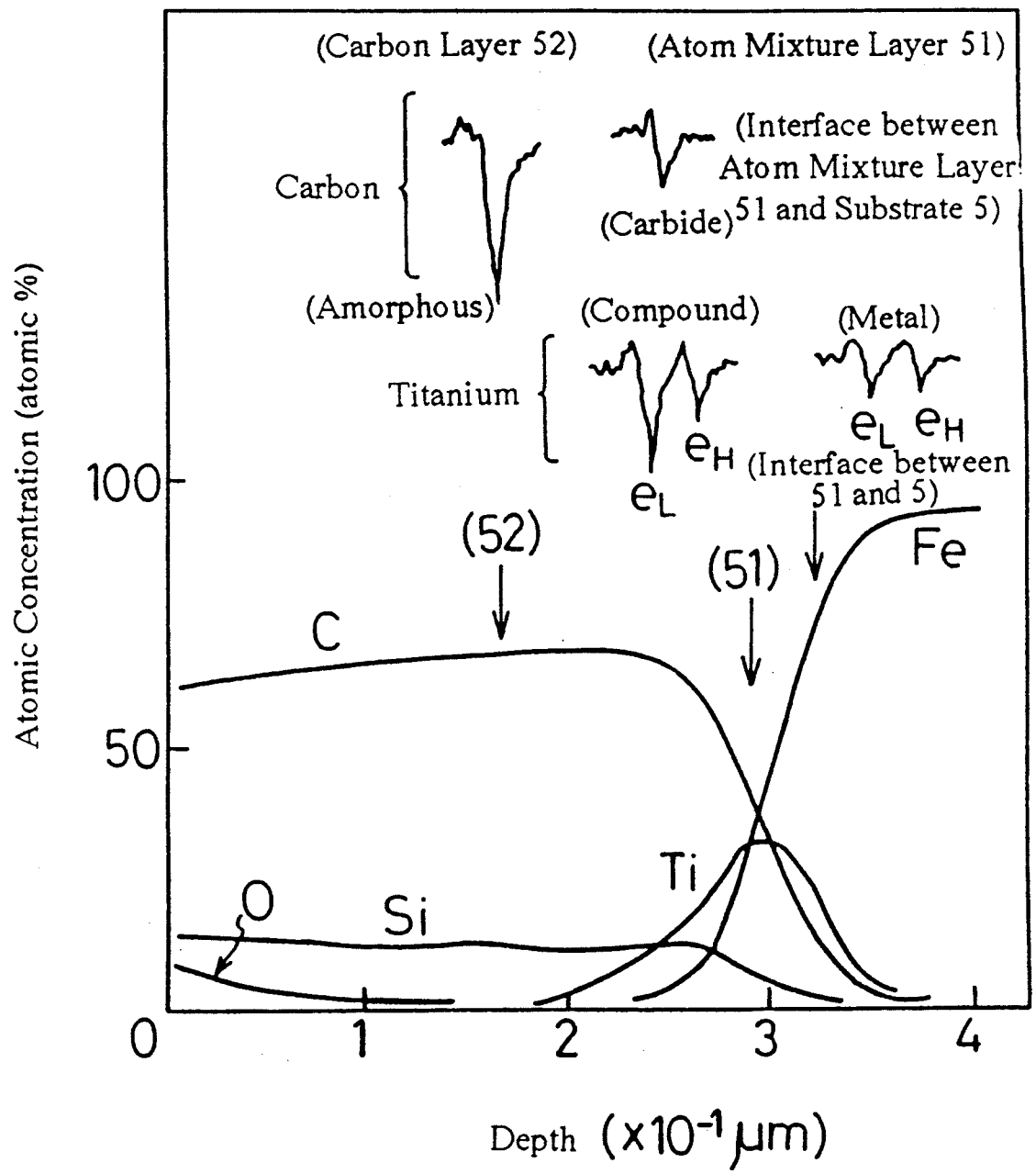
FIG. 4 shows depth-wise concentration distribution curves of elements obtained by analyzing the solid lubricating film formed in accordance with the First Preferred Embodiment of the present invention by the Augar electron spectroscopy, and also includes the Auger spectra of the elements constituting the solid lubricating film.

As can be seen from FIG. 4, it was found that the solid lubricating film 50 obtained in accordance with the First Preferred Embodiment included the atom mixture layer 51 formed on the surface of the substrate 5 and including iron constituting the substrate 5, the titanium deposited by the ion irradiation and carbon, and the carbon layer 52 formed integrally on the atom mixture layer 51 and including small amounts of hydrogen, oxygen and silicon but mainly including carbon. Further, it was also found that most of the hydrogen elements and the oxygen elements were evacuated from the solid lubricating film 50, and that the titanium deposited by the ion irradiation was distributed in a Gaussian distribution in the atom mixture layer 51 of the solid lubricating film 50.

In addition, it is apparent from the Auger spectra included in FIG. 4 that the carbon had a form of amorphous carbon in the carbon layer 52, and that the carbon had a form of carbide in the atom mixture layer 51. Moreover, the low energy peak (i.e., $e_L = 387$ eV) appears intenser than the high energy peak (i.e., $e_H = 418$ eV) does in the spectra of titanium included in the atom mixture layer 51. Therefore, the titanium included in the atom mixture layer 51 was found to be present in a form of compound. On the other hand, the high energy peak and the low energy peak have a substantially equal intensity in the spectra of titanium in the interface between the atom mixture layer 51 and the substrate 5. The fact implies that the titanium has a form of metal in the interface and formed an alloy together with the iron. Thus, according to the results of the Auger electron spectroscopy, it was found that the carbon layer 52 of the solid lubricating film 50 obtained in accordance with the First Preferred Embodiment included the amorphous carbon in a large amount, and that the atom mixture layer 51 thereof included titanium carbide (TiC) and an iron-titanium alloy.

Third Evaluation Test

Figure 5:
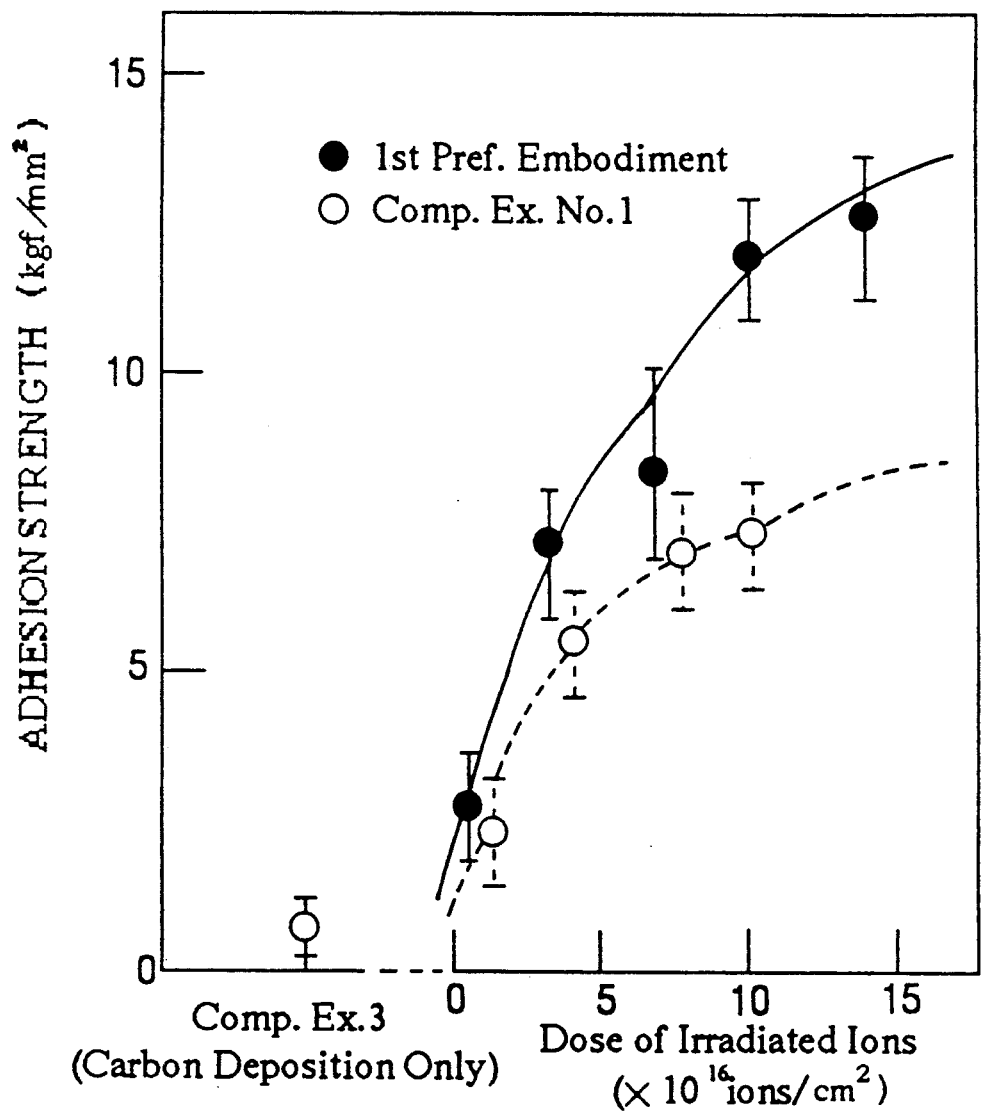
FIG. 5 is a graph showing relationships between adhesion strengths of solid lubricating films to disks made of SUJ2 and doses of ion irradiations, and the solid lubricating films were formed in accordance with the First Preferred Embodiment of the present invention, the Comparative Example No. 1 and a Comparative Example No. 3.

In order to evaluate an adhesion property of the solid lubricating film 50 obtained in accordance with the First Preferred Embodiment with respect to the substrate 5 made of the SUJ2 steel, a tensile strength test was carried out as a Third Evaluation Test under the following conditions. Namely, in the Third Evaluation Test, a tensile rod having a cross sectional area of 6.3 mm$^2$ and made of aluminum was vertically adhered on the solid lubricating film 50 with an epoxy adhesive. Then, the tensile rod was pulled gradually in order to measure an adhesion strength of the solid lubricating film 50 with respect to the substrate 5. For comparison purpose, the Comparative Example No. 1 and a Comparative Example No. 3 were prepared and evaluated similarly. The Comparative Example No. 1 was prepared under the same conditions as the First Preferred Embodiment except that argon ions (Ar+) having a high energy of 200 keV were irradiated instead of the Ti+ ions, and the Comparative Example No. 3 was prepared by simply depositing carbon on a disk made of the SUJ2 steel. In FIG. 5 shows the results of the Third Evaluation Test. In FIG. 5, the axis of abscissa specifies the doses of the irradiated ions, and the axis of ordinate specifies the adhesion strengths of the solid lubricating films.

It is apparent from FIG. 5 that at the dose of the irradiated titanium ion (Ti+) increases, the adhesion strength of the solid lubricating film 50 with respect to the substrate 5 improved. The degree of the improvement is more remarkable in the solid lubricating film 50 obtained in accordance with the First Preferred Embodiment than in the Comparative Example No. 1. There is an appreciable difference therebetween even when the doses of the irradiated ions reach $1 \times 10^{16}$ ions/cm$^2$.

SECOND AND THIRD PREFERRED EMBODIMENTS

In the Second and Third Preferred Embodiments, a disk, having a thickness of 3 mm, a diameter of 30 mm and a surface roughness of 0.1 micrometer Rz (ten-point mean roughness) and made of a stainless steel (SUS440C as per JIS), was employed as the substrate 5. As the organic material 7, pentaphenyl-trimethyltrisiloxane, one of the silicone-base polymers or oils, was employed. Further, titanium (Ti) was employed as the metal element having a chemical affinity to carbon in the Second Preferred Embodiment, and tantalum (Ta) was employed as the metal element in the Third Preferred Embodiment.

Furthermore, in the Second Preferred Embodiment, the vacuum container 1 was evacuated to the high vacuum degree of $10^{-6}$ Torr. The titanium (Ti) was turned into Ti+ ions having a high energy of 100 keV, and an ion beam 3 including the Ti+ ions was controlled to have an ion current density of approximately 2 microamperes/cm$^2$. Also in the Second Preferred Embodiment, the depositing the organic material 7 and simultaneously irradiating the Ti$^+$ ions therewith were carried out for approximately 1 hour, and the Ti$^+$ ions were irradiated at a dose of $1 \times 10^{17}$ ions/cm$^2$. However, other than the above-described conditions, the operation was carried out in the Second Preferred Embodiment under the same conditions as those of the First Preferred Embodiment. A thickness of a solid lubricating film 50 thus obtained was measured by the back-scattering spectroscopy and by the another method employing a surface roughness meter, and found to be 0.2 to 0.4 micrometers by the both methods.

Moreover, in the Third Preferred Embodiment, the vacuum container 1 was evacuated to the high vacuum degree of $10^{-6}$ Torr. The tantalum (Ta) was turned into Ta$^+$ ions having a high energy of 200 keV, and an ion beam 3 including the Ta$^+$ ions was controlled to have an ion current density of approximately 1 microamperes/cm$^2$. Also in the Third Preferred Embodiment, the depositing the organic material 7 and simultaneously irradiating the Ta$^+$ ions therewith were carried out for approximately 1 hour, and the Ta$^+$ ions were irradiated at a dose of $5 \times 10^{16}$ ions/cm$^2$. However, other than the above-described conditions, the operation was carried out in the Third Preferred Embodiment under the same conditions as those of the First Preferred Embodiment. A thickness of a solid lubricating film 50 thus obtained was measured by the back-scattering spectroscopy and by the another method employing a surface roughness meter, and found to be 0.2 to 0.4 micrometers by the both methods.

Fourth and Fifth Preferred Embodiments

In the Fourth and Fifth Preferred Embodiments, alkylnaphthalene, one of the hydrocarbon-base polymers or oils, was employed as the organic material 7, and heated to 80° C. with the heater furnace 6. However, other than the above-described conditions, the Fourth and Fifth Preferred Embodiments were carried out in the same manners as the Second and Third Preferred Embodiments, respectively. Thicknesses of solid lubricating films 50 thus obtained were measured by the back-scattering spectroscopy and by the another method employing a surface roughness meter, and found to be 0.2 to 0.4 micrometers for the Fourth and Fifth Preferred Embodiments by the both methods.

Fourth Evaluation Test

In order to evaluate the friction and abrasion properties of the SUS440C steel disks having the solid lubricating films 50 obtained in accordance with the Second, Third, Fourth and Fifth Preferred Embodiments, an evaluation test similar to the First Evaluation Test was carried out. However, the pin load was fixed at a predetermined value of 5N in the Fourth Evaluation Test. Table 1 summarizes the values of the friction coefficients ($\mu$), exhibited by the disks after the disks and the pin were slided for 1 hour under the condition described above, and critical number of sliding operations. The critical number of sliding operations is the times of the sliding operations at which the disks exhibited a friction coefficient ($\mu$) of 0.15 or more.

It is obvious from Table 1 that the solid lubricating films 50 having excellent friction and abrasion properties could be obtained, regardless of the fact that either pentaphenyl-trimethyltrisiloxane or alkylnaphthalene was employed as the organic material 7. Although the solid lubricating films 50 formed by employing tantalum (Ta) as the metal element having a chemical affinity to carbon (i.e., the Third and Fifth Preferred Embodiments) had the friction and abrasion properties slightly inferior to those of the solid lubricating films 50 formed by employing titanium (Ti) as the metal element (i.e., the Second and Fourth Preferred Embodiments), the characteristic values were found to be fully favorable for a solid lubricating film for sliding component parts.

Having now fully described the present invention, it will be apparent to one of ordinary skill in the art that many changes and modifications can be made thereto without departing from the spirit or scope of the present invention as set forth herein including the appended claims.

TABLE 1

| | Evaporation Source | | Ion Irradiation | | Friction Property | |
|---|---|---|---|---|---|---|
| | Organic Material | Heating Temp. (°C.) | Ion | Dose (ions/cm$^2$) | Friction Coefficient ($\mu$) | Number of Sliding Operations |
| 2nd Pref. Embodiment | Pentaphenyl-Trimethyl-Trisiloxane | 90 | Ti$^+$ (100 keV) | $1 \times 10^{17}$ | 0.06 | $>1 \times 10^5$ |
| 3rd Pref. Embodiment | Pentaphenyl-Trimethyl-Trisiloxane | 90 | Ta$^+$ (200 keV) | $5 \times 10^{16}$ | 0.08 | Approx. $1 \times 10^5$ |
| 4th Pref. Embodiment | Alkylnaphtalene | 80 | Ti$^+$ (100 keV) | $1 \times 10^{17}$ | 0.08 | Approx. $1 \times 10^5$ |
| 5th Pref. Embodiment | Alkylnaphtalene | 80 | Ta$^+$ (200 keV) | $5 \times 10^{16}$ | 0.10 | Approx. $0.8 \times 10^5$ |

What is claimed is:

1. A sliding member have a solid lubricating film thereon of improved adhesion to the underlying substrate comprising:
   (a) an iron-alloy substrate: and
   (b) a solid lubricating film on the surface of said iron-alloy substrate comprising
      (I) an amorphous carbon-coated having low friction properties; and
      (II) a mixed atom connecting layer which intervenes between the carbon-coated layer and said iron-alloy substrate comprising:
         (i) elements which constitute the iron-alloy substrate;
         (ii) a metal element which is titanium (Ti), tantalum (Ta), or combinations thereof; and
         (iii) elements which constitute the carbon-coated layer.

2. The sliding member according to Claim 1, wherein said metal element exhibits an atomic concentration distribution curve having a peak in said mixed atom connecting layer.

3. The sliding member according to Claim 1, wherein said mixed atom connecting layer is formed by depositing an organic material on said surface of said iron-alloy substrate, and simultaneously irradiating said surface having organic material deposited thereon with ions of said metal element.

4. The sliding member according to Claim 3, wherein said carbon-coated layer contains at least one element selected from the group consisting of hydrogen and silicon.

5. The sliding member according to claim 4, wherein said organic material is at least one member selected from the group consisting of methylphenylsiloxane, pentaphenyltrimethyltrisiloxane and alkylnaphthalene.

* * * * *

UNITED STATES PATENT AND TRADEMARK OFFICE
CERTIFICATE OF CORRECTION

PATENT NO. : 5,215,823
DATED : June 1, 1993
INVENTOR(S) : Akio Itoh, et al

It is certified that error appears in the above-indentified patent and that said Letters Patent is hereby corrected as shown below:

Column 10, line 50, after "carbon-coated", insert --layer --.

Signed and Sealed this

Twelfth Day of April, 1994

Attest:

BRUCE LEHMAN

*Commissioner of Patents and Trademarks*

*Attesting Officer*